(12) United States Patent
Taniguchi

(10) Patent No.: US 10,903,577 B2
(45) Date of Patent: Jan. 26, 2021

(54) PRINTED WIRING BOARD

(71) Applicant: IBIDEN CO., LTD., Ogaki (JP)

(72) Inventor: Hirotaka Taniguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 129 days.

(21) Appl. No.: 16/355,936

(22) Filed: Mar. 18, 2019

(65) Prior Publication Data

US 2019/0288398 A1 Sep. 19, 2019

(30) Foreign Application Priority Data

Mar. 16, 2018 (JP) .................................. 2018-049216

(51) Int. Cl.
| | | |
|---|---|---|
| *H01Q 13/10* | (2006.01) | |
| *H05K 3/00* | (2006.01) | |
| *H01Q 1/38* | (2006.01) | |
| *H05K 3/46* | (2006.01) | |
| *H05K 3/42* | (2006.01) | |
| *H05K 3/10* | (2006.01) | |
| *H05K 3/06* | (2006.01) | |

(52) U.S. Cl.
CPC .............. *H01Q 13/10* (2013.01); *H01Q 1/38* (2013.01); *H05K 3/0029* (2013.01); *H05K 3/0032* (2013.01); *H05K 3/0044* (2013.01); *H05K 3/06* (2013.01); *H05K 3/108* (2013.01); *H05K 3/428* (2013.01); *H05K 3/4652* (2013.01); *H05K 2203/0195* (2013.01); *H05K 2203/072* (2013.01); *H05K 2203/0723* (2013.01)

(58) Field of Classification Search
CPC .. H02J 50/12; H02J 50/60; H02J 50/90; H02J 7/025; H02J 50/70; H02J 50/80; H02J 50/50; H02J 5/005; H02J 7/0029; H02J 7/0047; H02J 50/10; H02J 7/00045; H02J 7/35; H02J 2310/48; H02J 50/05; H02J 50/40; H02J 7/00; H02J 2310/40; H02J 50/20; H02J 7/00034; H02J 2207/40; H02J 2300/28; H02J 50/23; H02J 50/30; H02J 7/0027; H02J 7/00304; H02J 7/34
See application file for complete search history.

(56) References Cited

U.S. PATENT DOCUMENTS

2019/0348749 A1* 11/2019 Thai ..................... H01Q 21/065

FOREIGN PATENT DOCUMENTS

JP        H05-243837 A     9/1993

* cited by examiner

*Primary Examiner* — Monica C King
(74) *Attorney, Agent, or Firm* — Oblon, McClelland, Maier & Neustadt, L.L.P.

(57) ABSTRACT

A printed wiring board includes a laminated structure including insulating layers, and conductive layers laminated on the insulating layer, respectively, such that the conductive layers include an outermost conductive layer having a radiation slot, and an inner-side conductive layer having an excitation portion facing the radiation slot in a lamination direction. The laminated structure has a recess portion recessed from the radiation slot toward the excitation portion such that a bottom surface of the recess portion is positioned between the outermost conductive layer and the excitation portion, and the insulating layers include an insulating layer having at least a portion covering the excitation portion.

20 Claims, 6 Drawing Sheets

US 10,903,577 B2

PRINTED WIRING BOARD

CROSS-REFERENCE TO RELATED APPLICATIONS

The present application is based upon and claims the benefit of priority to Japanese Patent Application No. 2018-049216, filed Mar. 16, 2018, the entire contents of which are incorporated herein by reference.

BACKGROUND OF THE INVENTION

Field of the Invention

The present invention relates to a printed wiring board.

Description of Background Art

For example, Japanese Patent Laid-Open Publication No. HEI 5-243837 describes a printed wiring board having an excitation part corresponding to a radiation slot. The entire contents of this publication are incorporated herein by reference.

SUMMARY OF THE INVENTION

According to one aspect of the present invention, a printed wiring board includes a laminated structure including insulating layers, and conductive layers laminated on the insulating layer, respectively, such that the conductive layers include an outermost conductive layer having a radiation slot, and an inner-side conductive layer having an excitation portion facing the radiation slot in a lamination direction. The laminated structure has a recess portion recessed from the radiation slot toward the excitation portion such that a bottom surface of the recess portion is positioned between the outermost conductive layer and the excitation portion, and the insulating layers include an insulating layer having at least a portion covering the excitation portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
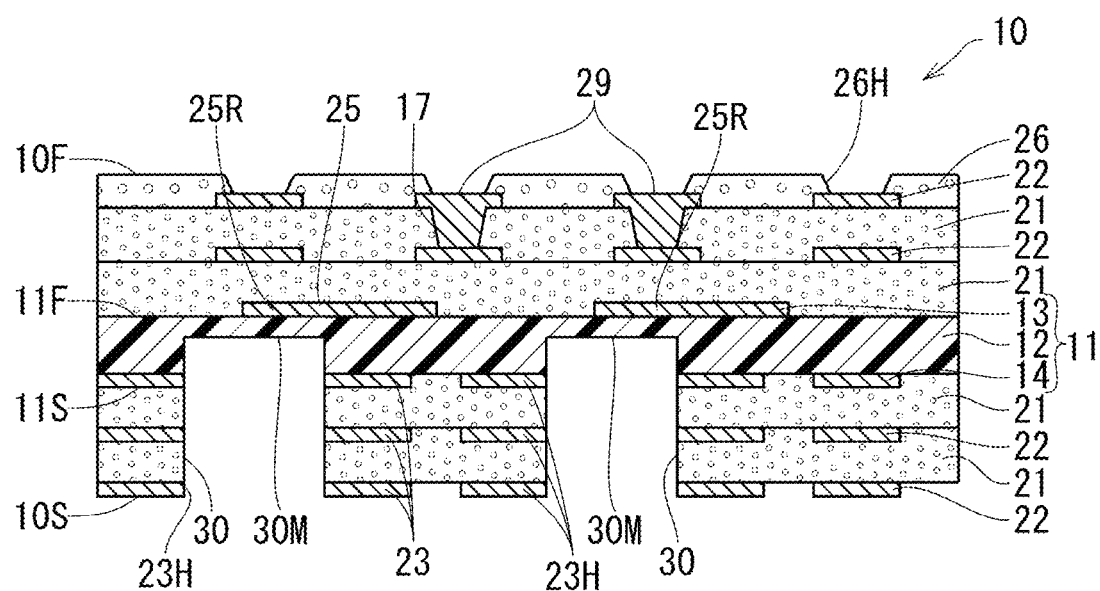
FIG. 1 is a cross-sectional view of a printed wiring board.

Embodiments will now be described with reference to the accompanying drawings, wherein like reference numerals designate corresponding or identical elements throughout the various drawings.

In the following, a printed wiring board 10 of the present embodiment is described based on FIG. 1-5. As illustrated in FIG. 1, the printed wiring board 10 of the present embodiment has a structure in which multiple insulating layers 21 and multiple conductive layers 22 are alternately laminated on both front and back sides of a core substrate 11. In the following, a front side surface of the printed wiring board 10 is referred to as an F surface (10F), and a surface on an opposite side thereof is referred to as an S surface (10S).

The core substrate 11 includes an insulating base material 12, and conductive layers (13, 14) that are respectively formed on front and back sides of the insulating base material 12. A wiring pattern 25 having an excitation part (25R) is formed in the conductive layer 13 formed on an F surface (11F) side among the conductive layers (13, 14) laminated on the insulating base material 12. A mesh conductor part 23 having a radiation slot (23H) is formed in the conductive layer 14 formed on an S surface (11S) side among the conductive layers (13, 14) laminated on the insulating base material 12.

Figure 2:
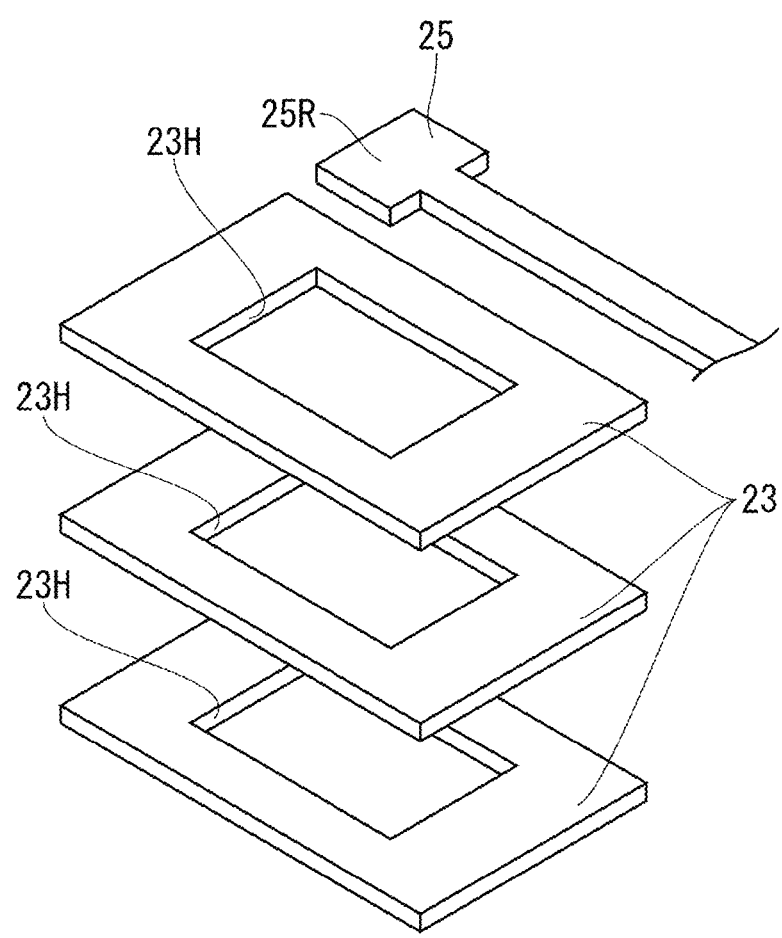
FIG. 2 is a schematic diagram of conductive layers in the printed wiring board.

As illustrated in FIG. 2, the wiring pattern 25 has an end portion larger than a width of a wiring, and the end portion is the excitation part (25R). The mesh conductor part 23 has the radiation slot (23H) larger than the excitation part (25R).

As illustrated in FIG. 1, the insulating layers 21 and the conductive layers 22 are alternately laminated on the F surface (11F) of the core substrate 11, and a solder resist layer 26 is further laminated on the outermost conductive layer 22. Further, openings (26H) are formed in the solder resist layer 26, and portions of the conductive layer 22 that are respectively exposed from the openings (26H) form pads 29. An arbitrary wiring pattern is formed in each of the conductive layers (22, 22) on the F surface (10F) side. The conductive layers (22, 22) on the F surface (10F) side are electrically connected to each other by via conductors 17.

The insulating layers 21 and the conductive layers 22 are alternately laminated on the S surface (11S) of the core substrate 11. A mesh conductor part 23 having a radiation slot (23H) is formed in each of the conductive layers (22, 22) on the S surface (10S) side. The radiation slot (23H) formed in each of the conductive layers (22, 22) on the S surface (10S) side and the radiation slot (23H) formed in the conductive layer 14 are arranged at positions that overlap each other in a thickness direction of the printed wiring board 10. The radiation slots (23H, 23H) are arranged at positions overlapping with the excitation part (25R). The excitation part (25R) is smaller than an area of each of the radiation slots (23H).

The printed wiring board 10 of the present embodiment has a recess 30 recessed from the radiation slot (23H) formed on the S surface (10S) side toward the excitation part. Then, a bottom surface (30M) of the recess 30 is arranged between the outermost conductive layer 22 having the radiation slot (23H) among the multiple conductive layers (22, 22) and the conductive layer 13 having the excitation part (25R).

Here, the wiring pattern 25 having the excitation part (25R) is covered by an insulating layer 21. Specifically, the bottom surface (30M) of the recess 30 is arranged at a position in middle of the insulating base material 12 adjacent to the conductive layer 13 having the excitation part (25R). A distance between the excitation part (25R) and the bottom surface (30M) of the recess 30, that is, a thickness of the insulating layer covering the excitation part (25R), is substantially 30-150 μm.

Further, the recess 30 is substantially perpendicularly formed with respect to the thickness direction of the printed wiring board 10. On a side surface of the recess 30, opening edges of the radiation slots (23H, 23H) respectively formed in the conductive layers (22, 22) are exposed.

The insulating base material 12 is formed by impregnating a core material (for example, a glass cloth) with a resin. The insulating base material 12 has a thickness of 60-200 μm. The insulating layers (21, 21) are each formed by impregnating a core material (for example, a glass cloth) with a resin. The insulating layers (21, 21) each have a thickness of 30-60 μm. The conductive layers (13, 14, 21) are each a metal layer containing, for example, copper as a main component, and each have a thickness of 10-30 μm.

The printed wiring board 10 is manufactured as follows.

Figure 3A:
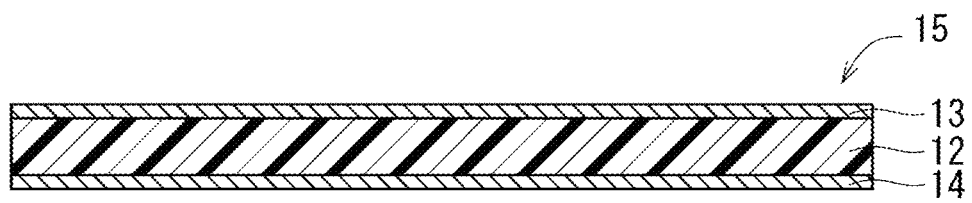
FIG. 3A-3D are cross-sectional views illustrating manufacturing processes of the printed wiring board.

(1) As illustrated in FIG. 3A, a substrate 15 is prepared in which the conductive layers (13, 14) are respectively laminated on both front and back sides of the insulating base material 12.

Figure 3B:
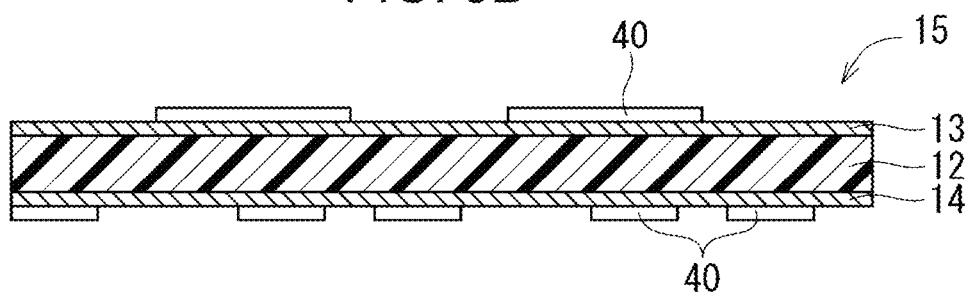

(2) As illustrated in FIG. 3B, an etching resist 40 of a predetermined pattern is formed on the conductive layers (13, 14).

Figure 3C:
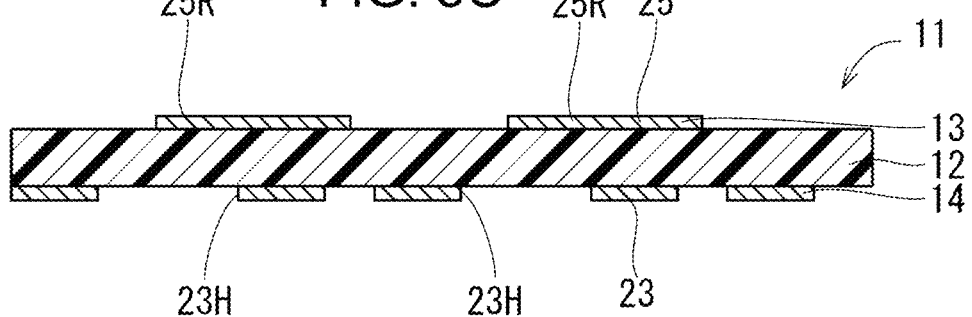

(3) Portions of the conductive layers (13, 14) that are not covered by the etching resist 40 are removed by etching. Then, as illustrated in FIG. 3C, the etching resist 40 is removed, the wiring pattern 25 having the excitation part (25R) is formed in the conductive layer 13 on the F surface (11F) side, and the mesh conductor part 23 having the radiation slot (23H) is formed in the conductive layer 14 on the S surface (11S) side.

Figure 3D:
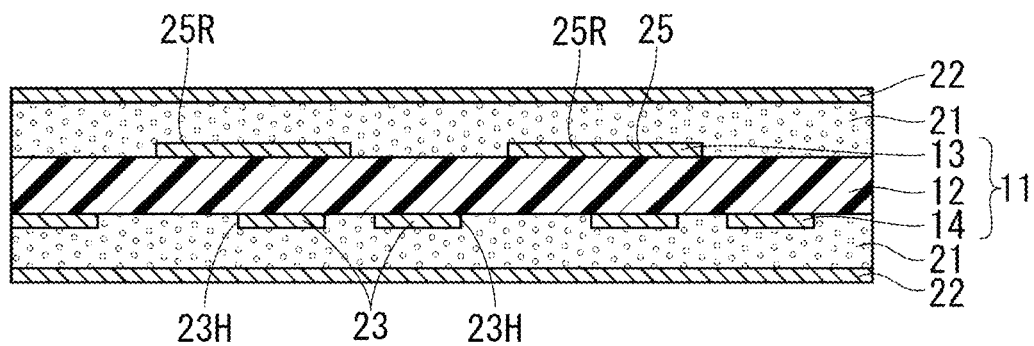

(4) As illustrated in FIG. 3D, an insulating layer 21 and a conductive layer 22 are superposed on each of both front and back sides of the core substrate 11, and the resulting object is hot pressed.

Figure 4A:
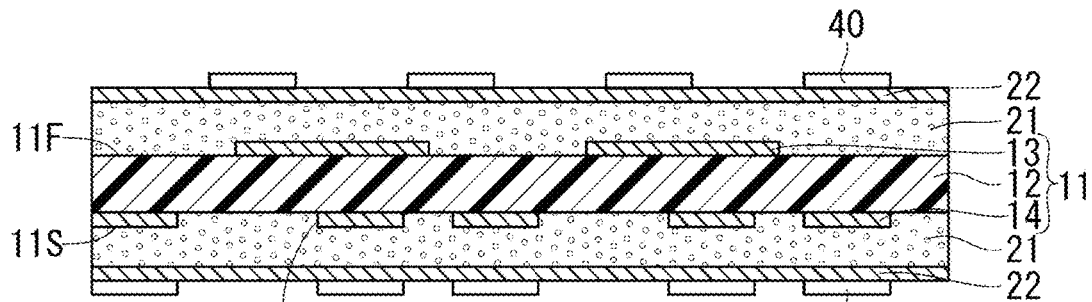
FIG. 4A-4D are cross-sectional views illustrating manufacturing processes of the printed wiring board.

(5) As illustrated in FIG. 4A, an etching resist 40 of a predetermined pattern is formed on the front side and back side conductive layers (22, 22).

Figure 4B:
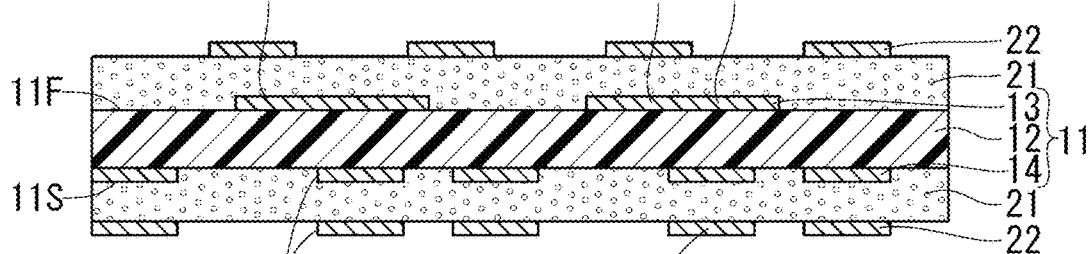

(6) Portions of the conductive layers 22 that are not covered by the etching resist 40 are removed by etching. Then, as illustrated in FIG. 4B, the etching resist 40 is removed, and the mesh conductor part 23 having the radiation slot (23H) is formed in the conductive layer 22 on the S surface (11S) side. In this case, the radiation slot (23H) of the conductive layer 22 is arranged at a position overlapping the radiation slot (23H) of the conductive layer 14.

Figure 4C:
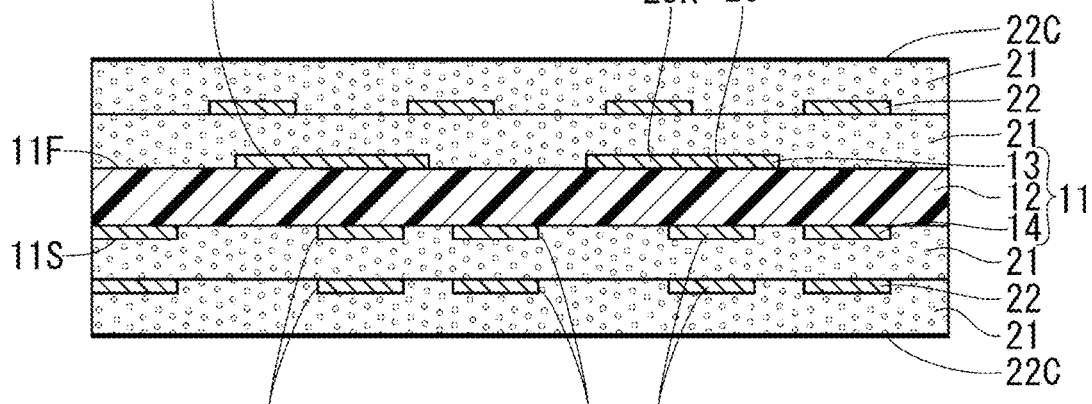

(7) As illustrated in FIG. 4C, insulating layers (21, 21) and metal foils (22C, 22C) are laminated on the front side and back side conductive layers (22, 22).

Figure 4D:
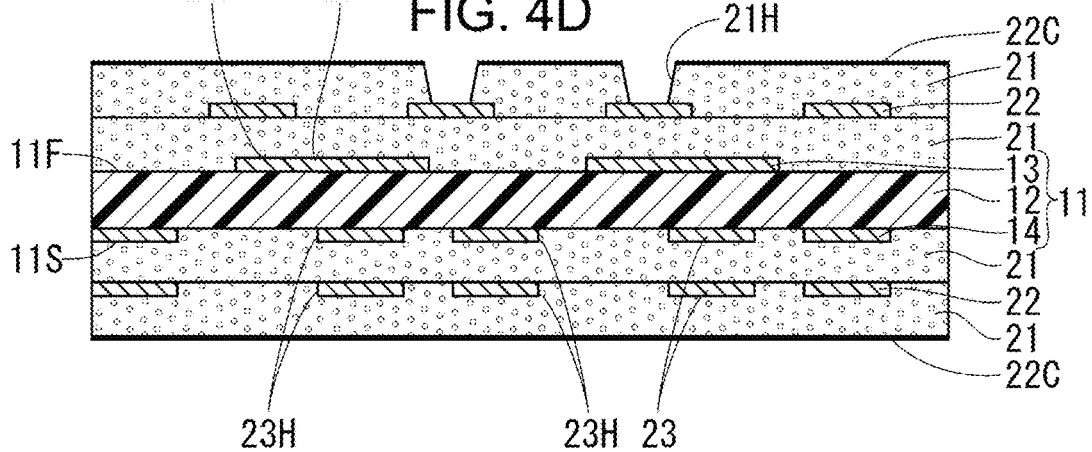

(8) As illustrated in FIG. 4D, multiple via holes (21H) are formed by irradiating laser to the insulating layer 21 on the F surface (10F) side. The multiple via holes (21H) are arranged on the conductive layer 22.

(9) Next, an electroless plating treatment is performed, and an electroless plating film (not illustrated in the drawings) is formed on the metal foils (22C, 22C) and on inner surfaces of the via holes (21H).

Figure 5A:
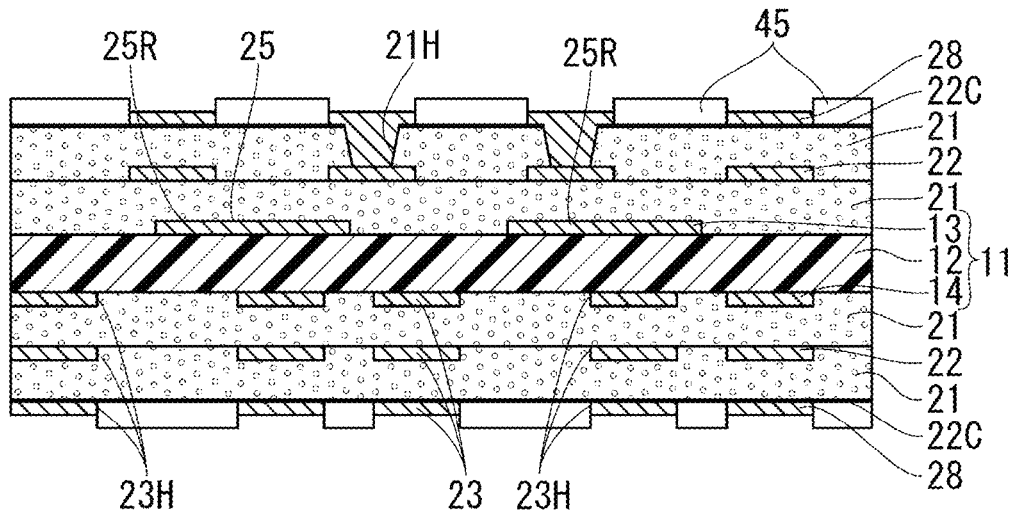
FIG. 5A-5C are cross-sectional views illustrating manufacturing processes of the printed wiring board.

(10) As illustrated in FIG. 5A, a plating resist 45 of a predetermined pattern is formed on the electroless plating film. Then, an electrolytic plating treatment is performed, and the via conductors 17 are formed by filling the via holes (21H) with electrolytic plating and an electrolytic plating film 28 is formed on portions of the electroless plating film that are exposed from the plating resist 45.

(11) Then, the plating resist 45 is peeled off, and the metal foil (22C) and the electroless plating film under the plating resist 45 are removed. Then, the conductive layers 22 are formed by the remaining metal foil (22C), electroless plating film and electrolytic plating film 28.

Figure 5B:
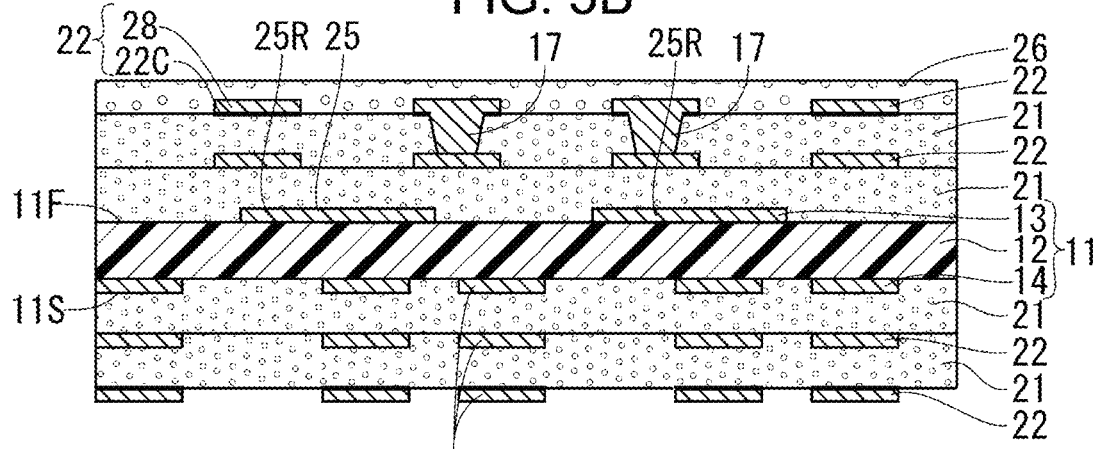

(12) Next, as illustrated in FIG. 5B, the solder resist layer 26 is formed on the conductive layer 22 on the F surface (11F) side.

Figure 5C:
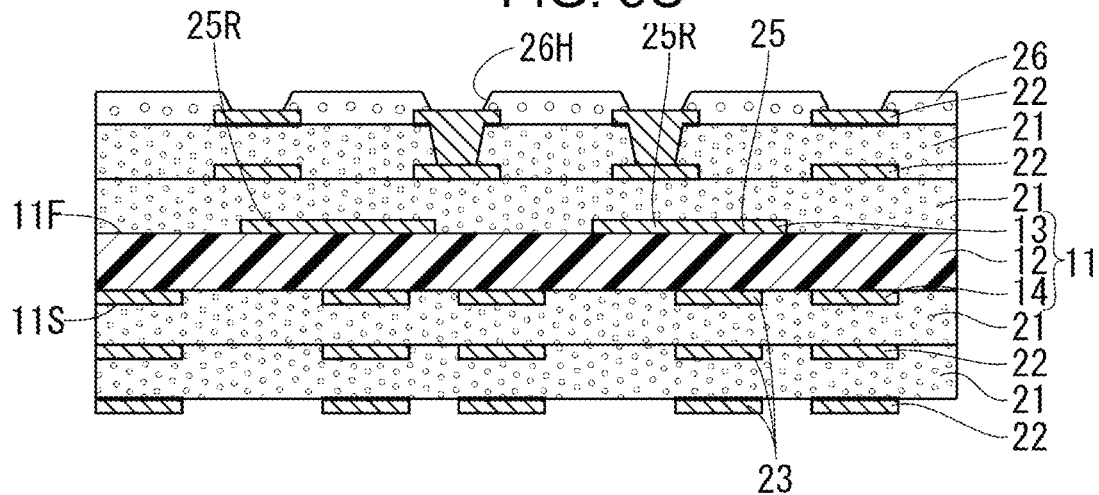

(13) Next, as illustrated in FIG. 5C, a photoresist treatment is performed, and the openings (26H) are formed in the solder resist layer 26. Then, the pads 29 are formed by portions of the conductive layer 22 on the F surface (10F) side that are respectively exposed by the openings (26H).

(14) Next, the recess 30 penetrating the radiation slots (23H) is formed from the S surface (11S) side toward the excitation part (25R) (FIG. 1). The recess 30 is formed using laser and a router, and is set in advance such that the bottom surface (30M) of the recess 30 is positioned in the middle of the insulating base material 12. As a result, the printed wiring board 10 illustrated in FIG. 1 is completed.

In this way, in the printed wiring board 10 of the present embodiment, the excitation part (25R) of the wiring pattern 25 of the inner-layer conductive layer is covered by a portion of the insulating base material 12. Therefore, damage to the wiring pattern 25 can be suppressed, and improvement in durability of the printed wiring board 10 can be achieved. Further, also in the manufacturing process, a direct contact of a router with the wiring pattern 25 can be suppressed. Therefore, damage to the wiring pattern 25 can be suppressed.

Further, by setting the thickness of the insulating base material 12 covering the excitation part (25R) to 150 μm or less, a defect due to a reduction in function of the excitation part (25R) can be suppressed.

Other Embodiments (1) The conductive layers (13, 14, 22) having the excitation part (25R) may each be formed of any conductive layer as long as the conductive layer is other than a conductive layer formed on an outermost side among the conductive layers of the printed wiring board 10.

(2) The bottom surface (30M) of the recess 30 may be arranged at any position as long as the position is between the conductive layer 13 having the wiring pattern 25 and the conductive layer 22 that is farthest from the conductive layer 13 having the wiring pattern 25 and has the mesh conductor part 23. In this case, the insulating layer 21 covering the excitation part (25R) preferably has a thickness of 75-150 μm.

(3) Multiple recesses 30 formed in the printed wiring board 10 may have different depths. In this case, the wiring pattern 25 having the excitation part (25R) may be formed in multiple conductive layers 22. Further, a conductive layer 22 may be formed to have both a wiring pattern 25 and a mesh conductor part 23, the wiring pattern 25 having an excitation part (25R).

Figure 6:
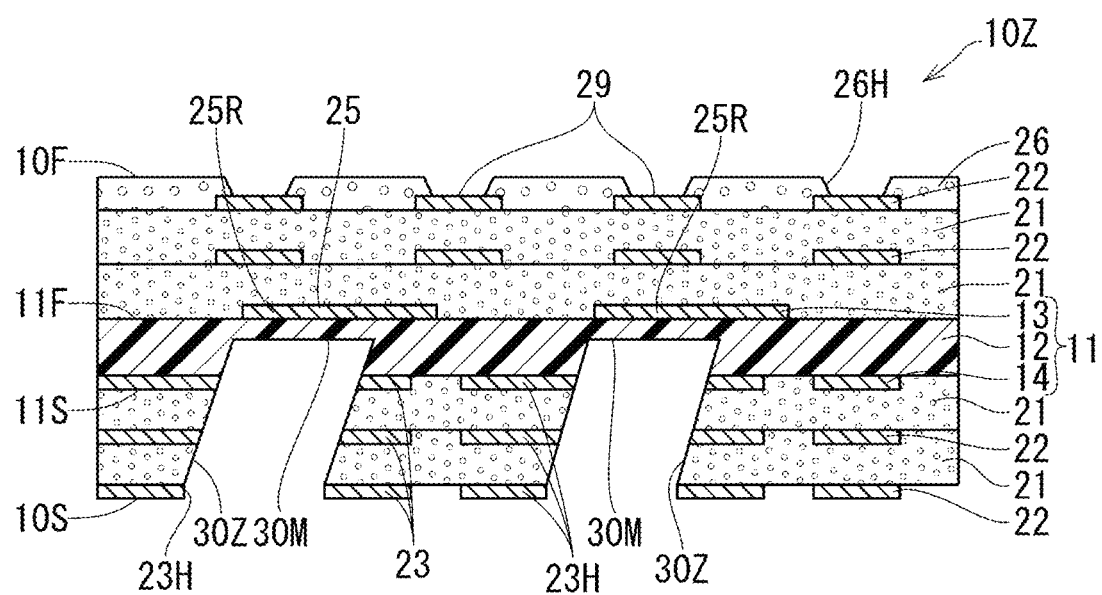
FIG. 6 is a cross-sectional view of a printed wiring board according to another embodiment.

(4) As illustrated in FIG. 6, a recess (30Z) may be obliquely formed with respect to a thickness direction of a printed wiring board (10Z).

(5) A solder resist layer 26 may be laminated on the outer-layer conductive layer 21 on the S surface (10S) side.

(6) In the printed wiring board 10, the conductive layers (22, 22) arranged on the F surface (10F) side relative to the excitation part (25R) may be connected to each other by vias or the like.

For the printed wiring board of Japanese Patent Laid-Open Publication No. HEI 5-243837, further improvement in durability is demanded.

A printed wiring board according to an embodiment of the present invention allows durability to be improved.

According to one aspect of the present invention, a printed wiring board includes: alternately laminated multiple insulating layers and multiple conductive layers; a radiation slot formed in at least one outermost conductive layer among the multiple conductive layers; an excitation part formed in one of inner-side conductive layers other than the outermost conductive layer and facing the radiation slot in a lamination direction; and a recess recessed from the radiation slot toward the excitation part. A bottom surface of the recess is positioned between the outermost conductive layer and the excitation part, and the excitation part is covered by at least a portion of one of the insulating layers.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a laminated structure comprising a plurality of insulating layers, and a plurality of conductive layers laminated on the insulating layer, respectively, such that the plurality of conductive layers includes an outermost conductive layer having a radiation slot, and an inner-side conductive layer having an excitation portion facing the radiation slot in a lamination direction,
    wherein the laminated structure has a recess portion recessed from the radiation slot toward the excitation portion such that a bottom surface of the recess portion is positioned between the outermost conductive layer and the excitation portion, and the plurality of insulating layers includes an insulating layer having at least a portion covering the excitation portion.

2. The printed wiring board according to claim 1, wherein the laminated structure is formed such that the bottom surface of the recess portion is formed in middle of the insulating layer in a thickness direction.

3. The printed wiring board according to claim 1, wherein the laminated structure is formed such that at least one of the insulating layers including the insulating layer is remaining between the bottom surface of the recess portion and the excitation portion.

4. The printed wiring board according to claim 1, wherein the laminated structure is formed such that a distance from the bottom surface of the recess portion to the excitation portion is in a range of 30 μm to 150 μm.

5. The printed wiring board according to claim 1, wherein the laminated structure is formed such that the plurality of conductive layers includes an inner-side conductive layer having a radiation slot between the outermost conductive layer and the excitation portion, and that the recess portion penetrates through the radiation slot of the inner-side conductive layer.

6. The printed wiring board according to claim 5, wherein the plurality of conductive layers is formed such that all inner-side conductive layers between the outermost conductive layer and the excitation portion have a radiation slot and that the recess portion penetrates through all of the radiation slots.

7. The printed wiring board according to claim 1, wherein the plurality of conductive layers is formed such that the outermost conductive layer has a plurality of radiation slots, and that the inner-side conductive layer has a plurality of excitation portions.

8. The printed wiring board according to claim 1, wherein the plurality of conductive layers is formed such that the outermost conductive layer has a plurality of radiation slots and that a plurality of inner-side conductive layers has a plurality of excitation portions respectively, and the laminated structure is formed such that a plurality of recess portions respectively corresponding to the excitation portions of the inner-side conductive layers is formed to have different depths.

9. The printed wiring board according to claim 1, wherein the laminated structure is formed such that an area of the excitation portion is smaller than an area of the bottom surface of the recess portion.

10. The printed wiring board according to claim 2, wherein the laminated structure is formed such that a distance from the bottom surface of the recess portion to the excitation portion is in a range of 30 μm to 150 μm.

11. The printed wiring board according to claim 2, wherein the laminated structure is formed such that the plurality of conductive layers includes an inner-side conductive layer having a radiation slot between the outermost conductive layer and the excitation portion, and that the recess portion penetrates through the radiation slot of the inner-side conductive layer.

12. The printed wiring board according to claim 11, wherein the plurality of conductive layers is formed such that all inner-side conductive layers between the outermost conductive layer and the excitation portion have a radiation slot and that the recess portion penetrates through all of the radiation slots.

13. The printed wiring board according to claim 2, wherein the plurality of conductive layers is formed such that the outermost conductive layer has a plurality of radiation slots, and that the inner-side conductive layer has a plurality of excitation portions.

14. The printed wiring board according to claim 2, wherein the plurality of conductive layers is formed such that the outermost conductive layer has a plurality of radiation slots and that a plurality of inner-side conductive layers has a plurality of excitation portions respectively, and the laminated structure is formed such that a plurality of recess portions respectively corresponding to the excitation portions of the inner-side conductive layers is formed to have different depths.

15. The printed wiring board according to claim 2, wherein the laminated structure is formed such that an area of the excitation portion is smaller than an area of the bottom surface of the recess portion.

16. The printed wiring board according to claim 3, wherein the laminated structure is formed such that a distance from the bottom surface of the recess portion to the excitation portion is in a range of 30 μm to 150 μm.

17. The printed wiring board according to claim 3, wherein the laminated structure is formed such that the plurality of conductive layers includes an inner-side conductive layer having a radiation slot between the outermost conductive layer and the excitation portion, and that the recess portion penetrates through the radiation slot of the inner-side conductive layer.

18. The printed wiring board according to claim 17, wherein the plurality of conductive layers is formed such that all inner-side conductive layers between the outermost conductive layer and the excitation portion have a radiation slot and that the recess portion penetrates through all of the radiation slots.

19. The printed wiring board according to claim 3, wherein the plurality of conductive layers is formed such that the outermost conductive layer has a plurality of radiation slots, and that the inner-side conductive layer has a plurality of excitation portions.

20. The printed wiring board according to claim 3, wherein the plurality of conductive layers is formed such that the outermost conductive layer has a plurality of radiation slots and that a plurality of inner-side conductive layers has a plurality of excitation portions respectively, and the laminated structure is formed such that a plurality of recess portions respectively corresponding to the excitation portions of the inner-side conductive layers is formed to have different depths.

* * * * *